United States Patent
Ohori et al.

(10) Patent No.: US 9,905,563 B2
(45) Date of Patent: Feb. 27, 2018

(54) SEMICONDUCTOR DEVICE

(71) Applicant: PANASONIC INTELLECTUAL PROPERTY MANAGEMENT CO., LTD., Osaka (JP)

(72) Inventors: Takahiro Ohori, Osaka (JP); Chikashi Hayashi, Osaka (JP); Manabu Yanagihara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/380,642

(22) Filed: Dec. 15, 2016

(65) Prior Publication Data
US 2017/0098649 A1 Apr. 6, 2017

Related U.S. Application Data

(63) Continuation of application No. PCT/JP2015/002894, filed on Jun. 10, 2015.

(30) Foreign Application Priority Data

Jun. 17, 2014 (JP) .................................. 2014-124010

(51) Int. Cl.
H01L 27/00 (2006.01)
H01L 29/00 (2006.01)
(Continued)

(52) U.S. Cl.
CPC ........ H01L 27/095 (2013.01); H01L 27/0629 (2013.01); H01L 27/098 (2013.01);
(Continued)

(58) Field of Classification Search
CPC . H01L 27/095; H01L 27/0629; H01L 27/098; H01L 27/105; H01L 27/124;
(Continued)

(56) References Cited

U.S. PATENT DOCUMENTS 6,101,077 A 8/2000 Matsumoto et al.
8,017,996 B2* 9/2011 Kaneko ............... H01L 27/0629
257/339
(Continued)

FOREIGN PATENT DOCUMENTS

JP S59-181560 A 10/1984
JP S62-211954 A 9/1987
(Continued)

OTHER PUBLICATIONS

Innternational Search Report and Written Opinion issued in International Patent Application No. PCT/JP2015/002894, dated Aug. 18, 2015; with partial English translation.

Primary Examiner — Nikolay Yushin
(74) Attorney, Agent, or Firm — McDermott Will & Emery LLP

(57) ABSTRACT

A semiconductor device includes: a first semiconductor layer stacked body including a compound semiconductor; a first field-effect transistor element including a first drain electrode, a first source electrode, and a first gate electrode that are provided on the first semiconductor layer stacked body; a second semiconductor layer stacked body including a compound semiconductor; and a second field-effect transistor element including a second drain electrode, a second source electrode, and a second gate electrode that are provided on the second semiconductor layer stacked body. The second gate electrode forms a Schottky junction or a p-n junction with the second semiconductor layer stacked body, the second drain electrode is connected to the first drain electrode, the second source electrode is connected to the first gate electrode, and the second gate electrode is connected to the first source electrode.

9 Claims, 11 Drawing Sheets

(51) Int. Cl.
| | |
|---|---|
| *H01L 27/095* | (2006.01) |
| *H01L 27/06* | (2006.01) |
| *H01L 27/098* | (2006.01) |
| *H01L 29/778* | (2006.01) |
| *H01L 29/20* | (2006.01) |
| *H01L 29/205* | (2006.01) |
| *H01L 29/423* | (2006.01) |

(52) U.S. Cl.
CPC ........ *H01L 29/2003* (2013.01); *H01L 29/205* (2013.01); *H01L 29/42316* (2013.01); *H01L 29/778* (2013.01)

(58) Field of Classification Search
CPC ............... H01L 27/04; H01L 29/42316; H01L 29/2003; H01L 29/205; H01L 29/778; H01L 29/78696

See application file for complete search history.

(56) References Cited

U.S. PATENT DOCUMENTS

| | | | |
|---|---|---|---|
| 8,300,031 B2* | 10/2012 | Kimura | G09G 3/20 |
| | | | 345/204 |
| 8,339,828 B2* | 12/2012 | Yamazaki | G11C 16/0433 |
| | | | 365/185.05 |
| 8,497,553 B2* | 7/2013 | Yamagiwa | H01L 27/0266 |
| | | | 257/192 |
| 2006/0238135 A1* | 10/2006 | Kimura | G09G 3/20 |
| | | | 315/169.3 |
| 2009/0257249 A1 | 10/2009 | Kaneko | |
| 2011/0193171 A1 | 8/2011 | Yamagiwa et al. | |
| 2014/0091366 A1* | 4/2014 | Jeon | H01L 21/8252 |
| | | | 257/195 |

FOREIGN PATENT DOCUMENTS

| | | |
|---|---|---|
| JP | S63-303514 A | 12/1988 |
| JP | 11-054711 A | 2/1999 |
| JP | 2009-259972 A | 11/2009 |
| JP | 2010-263032 A | 11/2010 |
| JP | 2011-165749 A | 8/2011 |

* cited by examiner

SEMICONDUCTOR DEVICE

CROSS REFERENCE TO RELATED APPLICATIONS

This application is a U.S. continuation application of PCT International Patent Application Number PCT/JP2015/002894 filed on Jun. 10, 2015, claiming the benefit of priority of Japanese Patent Application Number 2014-124010 filed on Jun. 17, 2014, the entire contents of which are hereby incorporated by reference.

BACKGROUND

1. Technical Field

The present disclosure relates to semiconductor devices, and particularly to a compound semiconductor device including a protection element.

2. Description of the Related Art

A compound semiconductor, in particular, a nitride semiconductor, is a semiconductor including a compound composed of boron (B), indium (In), aluminum (Al), or gallium (Ga), which is a group-III element, and nitrogen (N), which is a group-V element, and expressed by the chemical formula $B_w In_x Al_y Ga_z N$ where $w+x+y+z=1$, $0 \leq w,x,y,z \leq 1$.

The nitride semiconductor has advantages such as a high breakdown voltage, high electron saturation velocity, high electron mobility, and a high electron concentration at a heterojunction. A field-effect transistor (FET) using a nitride semiconductor shows promise as a power device that operates with high power and thus requires a high voltage tolerance.

The FET using a nitride semiconductor has a high voltage tolerance and low ON-resistance and therefore is capable of significantly reducing the element size of the FET, compared with an FET using a Si-based semiconductor in which a withstand voltage and ON-resistance during operation are set to be equal.

As the element size is reduced, however, the risk of breakage due to the surge voltage applied between electrodes increases. Common examples of the FET using a nitride semiconductor are two types of field-effect transistors, a metal-semiconductor field-effect transistor (MESFET) and a junction field-effect transistor (JFET). The MESFET and the JFET both have a high tolerance for the surge voltage for applying a positive bias to the gate electrode and have a low tolerance for the surge voltage for applying a negative bias to the gate electrode. Therefore, when the FET using a nitride semiconductor is used as a power switching element or the like, the tolerance for the negative surge voltage applied to the gate electrode is required to improve.

Adding a transistor for protection from surges has been proposed in Japanese Unexamined Patent Application Publication No. 2011-165749 (PTL 1) as a method of improving the tolerance for a negative surge voltage on the gate electrode of the FET using a nitride semiconductor.

SUMMARY

The semiconductor device including a protection transistor disclosed in PTL 1 is described with reference to the drawings. FIG. 17 is an equivalent circuit diagram illustrating the semiconductor device according to PTL 1. Second transistor 902 is connected between gate electrode 814 and first ohmic electrode 812 of first transistor 802. Second protecting element ohmic electrode 910 of second transistor 902 is connected to gate electrode 814 of first transistor 802, and first protecting element ohmic electrode 912 and protecting element gate electrode 914 of second transistor 902 are connected to first ohmic electrode 812 of first transistor 802. Therefore, when an excessive negative surge voltage is applied to gate electrode 814, second transistor 902 is turned ON to form an electric current path through which an electric current flows.

In the method in PTL 1, however, there is the problem that the protection is effective only against the surge voltage applied between gate electrode 814 and first ohmic electrode 812 of first transistor 802 and is not effective against the surge voltage applied between gate electrode 814 and second ohmic electrode 810 of first transistor 802.

The present disclosure has an object to solve the aforementioned problem and provide protection between the gate electrode and the source electrode and protection between the gate electrode and the source electrode by a single protection element to improve the tolerance for a surge voltage.

In order to achieve the aforementioned object, the semiconductor device according to one aspect of the present disclosure includes: a first semiconductor layer stacked body including a compound semiconductor; a first field-effect transistor element including a first drain electrode, a first source electrode, and a first gate electrode that are provided on the first semiconductor layer stacked body; a second semiconductor layer stacked body including a compound semiconductor; and a second field-effect transistor element including a second drain electrode, a second source electrode, and a second gate electrode that are provided on the second semiconductor layer stacked body, the second field-effect transistor element serving as a protection element for the first field-effect transistor element, wherein the first field-effect transistor element includes a first channel layer and a first barrier layer provided on the first channel layer, the second field-effect transistor element includes a second channel layer and a second barrier layer provided on the second channel layer, the second gate electrode forms either one of a Schottky junction and a p-n junction with the second semiconductor layer stacked body, the second drain electrode is electrically connected to the first drain electrode, the second source electrode is electrically connected to the first gate electrode, and the second gate electrode is electrically connected to the first source electrode.

The second field-effect transistor element functions as a protection element against a surge voltage applied to the first field-effect transistor element.

In the semiconductor device according to the present disclosure, when a surge voltage that is negative with respect to the first source electrode is applied to the first gate electrode of the first field-effect transistor element, the second gate electrode connected to the first source electrode has a positive potential with respect to the second source electrode connected to the first gate electrode. The second gate electrode forms a Schottky junction or a p-n junction with the semiconductor layer stacked body, and thus an electric current can flow from the second gate electrode to the semiconductor layer stacked body. Specifically, a surge current can flow from an external source terminal connected to the first source electrode to an external gate terminal connected to the first gate electrode through the second gate electrode and the second source electrode, and thus it is possible to reduce a surge voltage generated between the first gate electrode and the first source electrode.

Furthermore, when a surge voltage that is negative with respect to the first drain electrode of the first field-effect transistor element is applied to the first gate electrode of the first field-effect transistor element, the potential at the second gate electrode which is a floating electrode increases due to capacitive coupling to the second drain electrode connected to the first drain electrode, resulting in the second field-effect transistor element being turned ON. This allows a surge current to flow from an external drain terminal connected to the first drain electrode to the external gate terminal connected to the first gate electrode through the second drain electrode and the second source electrode, and thus it is possible to reduce a surge voltage generated between the first gate electrode and the first drain electrode.

As described above, introducing a single second field-effect transistor element makes it possible to improve the tolerance for a negative surge voltage applied to the first gate electrode of the first field-effect transistor element, not only between the first gate electrode and the first source electrode of the first field-effect transistor element, but also between the first gate electrode and the drain electrode of the first field-effect transistor element.

With the semiconductor device according to one aspect of the present disclosure, it is possible to provide a field-effect transistor element having improved tolerance for a surge voltage applied to the gate electrode by using a single protection element that provides protection both between the gate electrode and the source electrode and between the gate electrode and the drain electrode.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments of the present disclosure will be described with reference to the drawings. Note that the present disclosure is not limited to the following embodiments.

Embodiment 1

Figure 1:
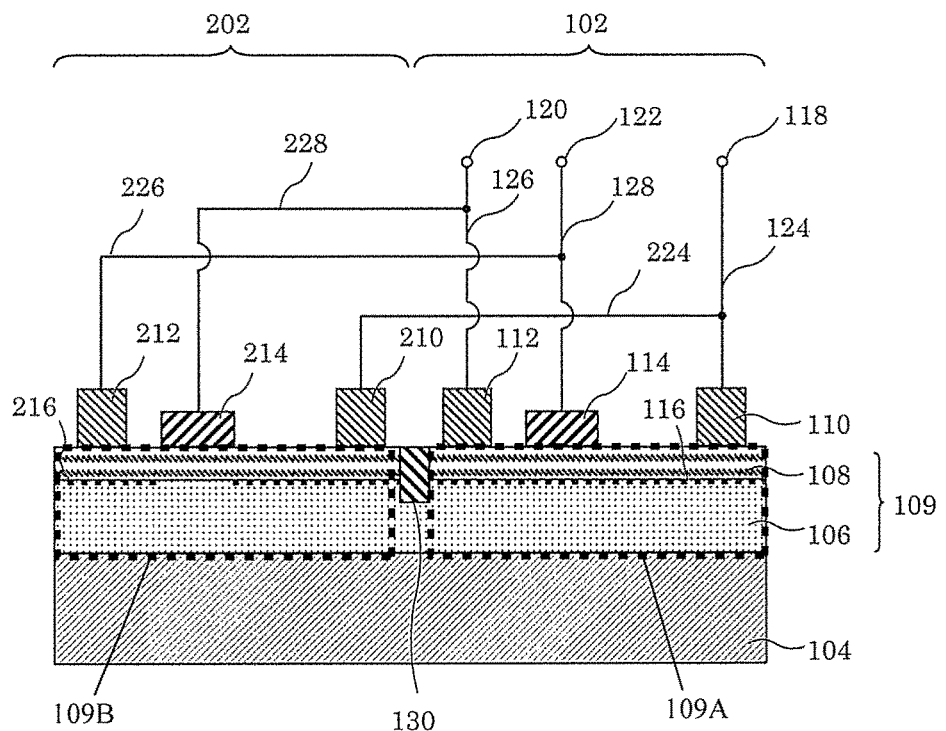
FIG. 1 is a cross-sectional view illustrating a semiconductor device according to Embodiment 1.
Figure 2:
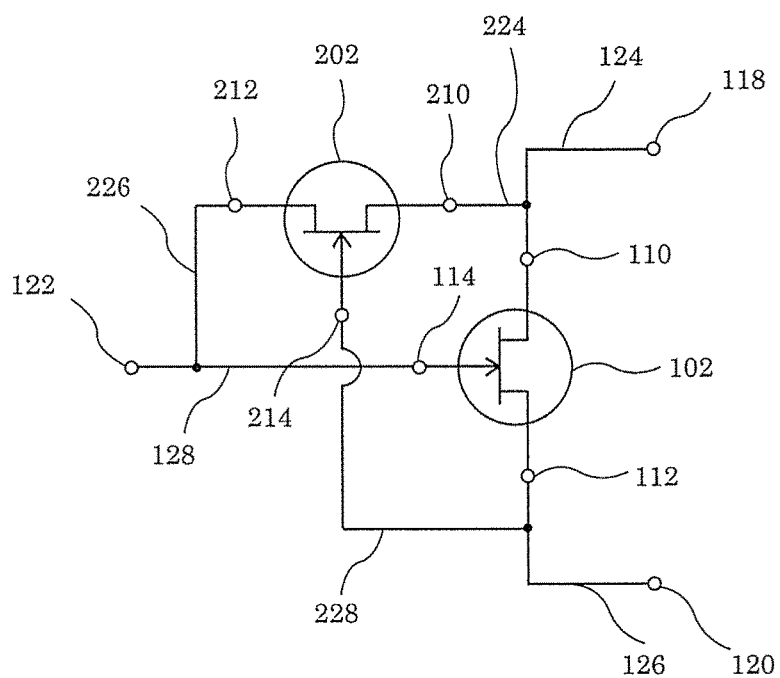
FIG. 2 is an equivalent circuit diagram illustrating a semiconductor device according to Embodiment 1.

A semiconductor device according to Embodiment 1 will be described below with reference to the drawings. FIG. 1 is a schematic cross-sectional view illustrating a semiconductor device according to Embodiment 1. FIG. 2 is an equivalent circuit diagram illustrating a semiconductor device according to Embodiment 1. As illustrated in FIG. 1 and FIG. 2, the semiconductor device according to the present embodiment includes first field-effect transistor element 102 and second field-effect transistor element 202, each of which is made from a compound semiconductor.

As illustrated in FIG. 1, in the present embodiment, 1 µm to 2 µm-thick channel layer 106 made of undoped GaN is formed on substrate 104 made of silicon, and approximately 50 nm-thick barrier layer 108 made of undoped AlGaN is formed on channel layer 106. The thickness of barrier layer 108 is preferably in the range from 10 nm to 100 nm.

Herein, "undoped" means the state where impurities are not intentionally introduced, therefore including the state where impurities such as carbon are unintentionally mixed. In this case, the concentration of carbon impurities is desirably not higher than $1 \times 10^{14}$ cm$^{-3}$. When barrier layer 108 is formed on channel layer 106, spontaneous polarization or piezoelectric polarization causes highly concentrated two-dimensional electron gas to be generated at the junction interface, and this highly concentrated two-dimensional electron gas forms first channel region 116 and second channel region 216. Channel layer 106 and barrier layer 108 form semiconductor layer stacked body 109, which includes a first semiconductor layer stacked body 109A and a second semiconductor layer stacked body 109B.

First channel region 116 and second channel region 216 are electrically separated by first element isolation region 130. First element isolation region 130, which is made from a material that can prevent the transfer of carriers such as electrons, can be formed by implanting boron ions, iron ions, or other ions in channel layer 106 and barrier layer 108.

As the materials of channel layer 106 and barrier layer 108, it is possible to use nitride semiconductors including Al and Ga. For example, the material of barrier layer 108 has a wider band gap than the band gap of the material of channel layer 106. Specifically, $Al_aGa_{1-a}N$ (where $0 \leq a \leq 1$) can be used as the material of channel layer 106, and $Al_bGa_{1-b}N$ (where $0 \leq b \leq 1$ and $b > a$) can be used as the material of barrier layer 108. In the present embodiment, GaN (that is, a=0) is used as the material of channel layer 106, and $Al_{0.2}Ga_{0.8}N$ (that is, b=0.2) is used as the material of barrier layer 108.

First drain electrode 110, first source electrode 112, and first gate electrode 114 are formed above channel layer 106 with barrier layer 108 therebetween. Note that first drain electrode 110 and first source electrode 112 are in ohmic contact with first channel region 116. First field-effect transistor element 102 includes first drain electrode 110, first source electrode 112, first gate electrode 114, and barrier layer 108 and channel layer 106 that are connected to these electrodes.

First gate electrode 114 is configured to allow an electric current to flow to first channel region 116 by forming a Schottky junction or a p-n junction with barrier layer 108 or channel layer 106. Furthermore, first gate electrode 114 may be formed above barrier layer 108 or channel layer 106 via an insulating film, having a configuration in which no current flows to first channel region 116. In other words, first field-effect transistor element 102 may be any of a metal-semiconductor field-effect transistor, a junction field-effect transistor, and a metal-insulator-semiconductor field-effect transistor (MISFET).

Note that a trench may be formed in barrier layer 108, and first source electrode 112, first drain electrode 110, or first gate electrode 114 may be formed on the trench. First drain electrode 110, first source electrode 112, and first gate electrode 114 may be formed in contact with channel layer 106 without the interposition of barrier layer 108.

First gate electrode 114 is not formed at the center between first drain electrode 110 and first source electrode 112, but is formed at a position closer to first source electrode 112 than to first drain electrode 110. In other words, the distance between first drain electrode 110 and first gate electrode 114 is greater than the distance between first source electrode 112 and first gate electrode 114. With this, even when a high voltage of, for example, 100 V or more, is applied to first drain electrode 110 of first field-effect transistor element 102, first field-effect transistor element 102 can be operated.

For example, a layer made of metal such as Ti, Al, Mo, or Hf can be used as first drain electrode 110 and first source electrode 112. Two or more layers made of these kinds of metal may be combined to form a stacked body.

A layer made of metal such as Ti, Al, Ni, Pt, Pd, Au, Mo, or Hf may be used as first gate electrode 114. Two or more layers made of these kinds of metal may be combined to form a stacked body. Alternatively, a stacked body composed of the metal layer just described and a p-type semiconductor may be used as first gate electrode 114. In this case, the p-type semiconductor is inserted between the metal layer and channel layer 106. In the case of combining the metal layer and the p-type semiconductor into a stacked body as first gate electrode 114, it is possible to use, for example, magnesium (Mg)-doped p-type $In_cAl_dGa_{1-(c+d)}N$ (where $0 \le c \le 1$ and $0 \le d \le 1$), and may also be possible to use p-type GaN (i.e., c=d=0), as the p-type semiconductor.

First drain electrode 110, first source electrode 112, and first gate electrode 114 are connected to external drain terminal 118, external source terminal 120, and external gate terminal 122, respectively. First drain electrode 110 and external drain terminal 118 are electrically connected to each other by line 124, first source electrode 112 and external source terminal 120 are electrically connected to each other by line 126, and first gate electrode 114 and external gate terminal 122 are electrically connected to each other by line 128.

Furthermore, in a region other than the region in which first field-effect transistor element 102 is formed, second drain electrode 210, second source electrode 212, and second gate electrode 214 are formed above channel layer 106 via barrier layer 108.

Second drain electrode 210 and second source electrode 212 are in ohmic contact with second channel region 216. Second field-effect transistor element 202 includes second drain electrode 210, second source electrode 212, second gate electrode 214, and barrier layer 108 and channel layer 106 that are connected to these electrodes.

Second gate electrode 214 allows an electric current to flow to second channel region 216 by forming a Schottky junction or a p-n junction with barrier layer 108 or channel layer 106. In other words, second field-effect transistor element 202 may be a metal-semiconductor field-effect transistor or a junction field-effect transistor.

A trench may be formed in barrier layer 108, and second source electrode 212, second drain electrode 210, or second gate electrode 214 may be formed on the trench. As with first field-effect transistor element 102, the distance between second drain electrode 210 and second gate electrode 214 is set to be greater than the distance between second source electrode 212 and second gate electrode 214. With this, even when a high voltage of, for example, 100 V or more, is applied to second drain electrode 210 connected to first drain electrode 110, second field-effect transistor element 202 can be operated.

Second drain electrode 210 is electrically connected to first drain electrode 110 by line 224, second source electrode 212 is electrically connected to first gate electrode 114 by line 226, and second gate electrode 214 is electrically connected to first source electrode 112 by line 228.

In the present embodiment, second field-effect transistor element 202 is a normally-off field-effect transistor element. With this, when the voltage between first source electrode 112 and first gate electrode 114 of first field-effect transistor element 102 is 0 V, the voltage between second source electrode 212 and second gate electrode 214 is also 0 V, and thus second field-effect transistor element 202 is in OFF state, having no adverse effect on operations of first field-effect transistor element 102.

Since second field-effect transistor element 202 is a normally-off field-effect transistor element, a material that forms a depletion layer in barrier layer 108 and channel layer 106 from second gate electrode 214 toward substrate 104 is used as second gate electrode 214. With this, even when the voltage applied to second gate electrode 214 is 0 V, the electric current flowing through second channel region 216 can be cut off.

For second drain electrode 210, second source electrode 212, and second gate electrode 214, it is possible to use materials and configurations that are the same as or similar to those of first drain electrode 110, first source electrode 112, and first gate electrode 114.

Next, operations of the semiconductor device according to the present embodiment will be described with reference to FIG. 3A and FIG. 3B.

Figure 3A:
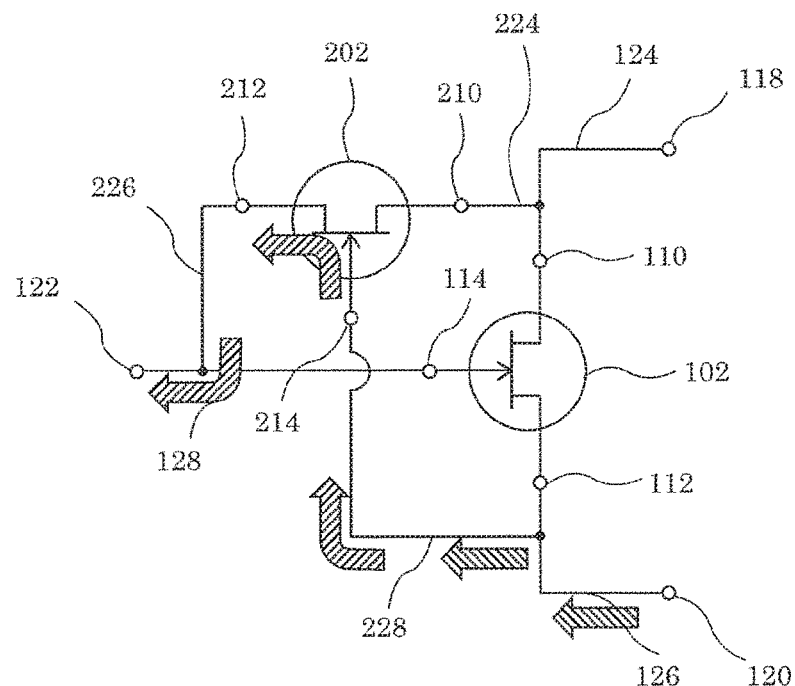
FIG. 3A illustrates a flow of a surge current in a semiconductor device according to Embodiment 1.
Figure 3B:
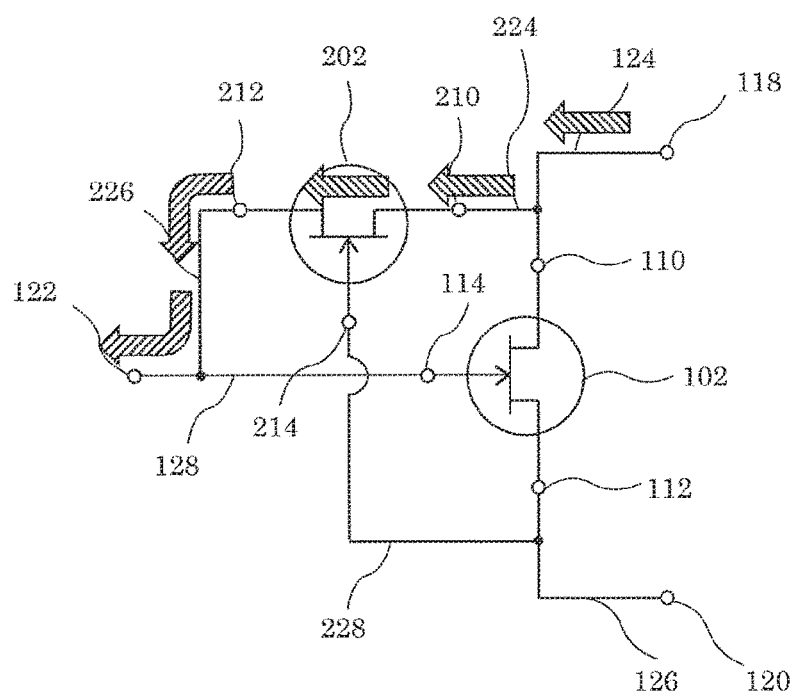
FIG. 3B illustrates a flow of a surge current in a semiconductor device according to Embodiment 1.

FIG. 3A illustrates a first example of a flow of a surge current in the semiconductor device according to Embodiment 1. FIG. 3B illustrates a second example of a flow of a surge current in the semiconductor device according to Embodiment 1. First, the first example in which a surge voltage that is negative with respect to first source electrode 112 is applied to first gate electrode 114 of first field-effect transistor element 102 is described. The negative surge voltage is applied via external gate terminal 122 and external source terminal 120. In this case, second gate electrode 214 connected to first source electrode 112 has a positive potential with respect to second source electrode 212 connected to first gate electrode 114. Second gate electrode 214, which forms a Schottky junction or a p-n junction with the semiconductor layer stacked body including barrier layer 108 or channel layer 106, allows an electric current to flow to second channel region 216. This allows a surge current to flow from external source terminal 120 connected to first source electrode 112 to external gate terminal 122 connected to first gate electrode 114, through second gate electrode 214 and second source electrode 212, as indicated by the arrows in FIG. 3A. Thus, it is possible to reduce a surge voltage generated between first gate electrode 114 and first source electrode 112.

This means that it is possible to improve the tolerance of first field-effect transistor element 102 for a surge voltage when a surge voltage that is negative with respect to first source electrode 112 is applied to first gate electrode 114.

Next, the second example in which a surge voltage that is negative with respect to first drain electrode 110 is applied to first gate electrode 114 of first field-effect transistor element 102 is described. The negative surge voltage is applied via external gate terminal 122 and external drain terminal 118. Since second gate electrode 214 is a floating electrode, the voltage of second gate electrode 214 increases due to capacitive coupling between second gate electrode 214 and second drain electrode 210 connected to first drain electrode 110, resulting in second field-effect transistor element 202 being turned ON. This allows a surge current to flow from external drain terminal 118 connected to first drain electrode 110 to external gate terminal 122 connected to first gate electrode 114, through second drain electrode 210 and second source electrode 212, as illustrated by the arrows in FIG. 3B. With this, it is possible to reduce a surge voltage generated between first gate electrode 114 and first drain electrode 110.

This means that it is possible to improve the tolerance of first field-effect transistor element 102 for a surge voltage when a surge voltage that is negative with respect to first drain electrode 110 is applied to first gate electrode 114.

As described above, introducing single second field-effect transistor element 202 makes it possible to improve the tolerance for a negative surge voltage applied to first gate electrode 114 of first field-effect transistor element 102, not only between first gate electrode 114 and first source electrode 112 of first field-effect transistor element 102, but also between first gate electrode 114 and drain electrode 110 of first field-effect transistor element 102.

Furthermore, it is also possible to improve the tolerance of first field-effect transistor element 102 for a surge voltage when a surge voltage that is positive with respect to first drain electrode 110 is applied to first source electrode 112.

The following describes the case where a surge voltage that is positive with respect to first drain electrode 110 of first field-effect transistor element 102 is applied to first source electrode 112 of first field-effect transistor element 102. The positive surge voltage is applied via external source terminal 120 and external drain terminal 118. In this case, second gate electrode 214 connected to first source electrode 112 has a positive potential with respect to second drain electrode 210 connected to first drain electrode 110. This allows an electric current to flow from external source terminal 120 connected to first source electrode 112 to external drain terminal 118 connected to first drain electrode 110 through second gate electrode 214 and second drain electrode 210. With this, it is possible to reduce a surge voltage generated between first source electrode 112 and first drain electrode 110. Thus, the tolerance for a surge voltage can be improved also when a surge voltage that is positive with respect to first drain electrode 110 is applied to first source electrode 112.

In the present embodiment, first field-effect transistor element 102 may be a normally-on field-effect transistor element, and may alternatively be a normally-off field-effect transistor element. In the case where first field-effect transistor element 102 is a normally-off first field-effect transistor element, when this semiconductor device is used as a power switching element, an accident such as an electrical short circuit can be prevented even if a failure occurs in a gate drive circuit, and thus the security of the device can be ensured. Note that first field-effect transistor element 102 can be configured as a normally-off field-effect transistor element by using, as first gate electrode 114, a material that forms a depletion layer in barrier layer 108 and channel layer 106 from first gate electrode 114 toward substrate 104.

Furthermore, in the present embodiment, first field-effect transistor element 102 may have a configuration that allows an electric current to flow from first gate electrode 114 to first channel region 116, as represented by a MESFET or a JFET. Alternatively, first field-effect transistor element 102 may have a configuration that does not allow an electric current to flow from first gate electrode 114 to first channel region 116, as represented by a MISFET.

In the case where first field-effect transistor element 102 is configured to allow an electric current to flow from first gate electrode 114 to first channel region 116, the tolerance for a positive surge voltage applied to first gate electrode 114 can be improved both between first gate electrode 114 and first source electrode 112 and between first gate electrode 114 and first drain electrode 110.

An electric current can flow from first gate electrode 114 to first channel region 116 both when a surge voltage that is positive with respect to first source electrode 112 is applied to first gate electrode 114 and when a surge voltage that is positive with respect to first drain electrode 110 is applied to first gate electrode 114. Therefore, a surge current can flow from first gate electrode 114 to first source electrode 112 or from first gate electrode 114 to first drain electrode 110.

With this, it is possible to reduce a high surge voltage generated between first gate electrode 114 and first source electrode 112 or a high surge voltage generated between first gate electrode 114 and first drain electrode 110. Thus, the tolerance for a positive surge voltage applied to first gate electrode 114 can be improved.

In the present embodiment, an electrode of first field-effect transistor element 102 and an electrode of second field-effect transistor element 202 may be formed in the same electrode manufacturing process. This allows the process of manufacturing the semiconductor device according to the present embodiment to be significantly simplified compared with the case in which these electrodes are formed in separate electrode manufacturing processes.

In the present embodiment, second field-effect transistor element 202 may be smaller in element size than first field-effect transistor element 102. In this case, it is possible to reduce the increase in parasitic capacitance of first field-effect transistor element 102 that is due to second field-effect transistor element 202. Specifically, the element size of second field-effect transistor element 202 is preferably one tenth to one thousandth, more preferably about one hundredth, of that of first field-effect transistor element 102.

In the present embodiment, the materials of channel layer 106 and barrier layer 108 in first field-effect transistor element 102 and the materials of channel layer 106 and barrier layer 108 in second field-effect transistor element 202 may be different from each other. In such a case, channel layer 106 and barrier layer 108 for first field-effect transistor element 102 and channel layer 106 and barrier layer 108 for second field-effect transistor element 202 may be formed in different manufacturing processes using substrate 104 as a common substrate. Alternatively, first field-effect transistor element 102 and second field-effect transistor element 202 may be formed using separate substrates 104.

Figure 4:
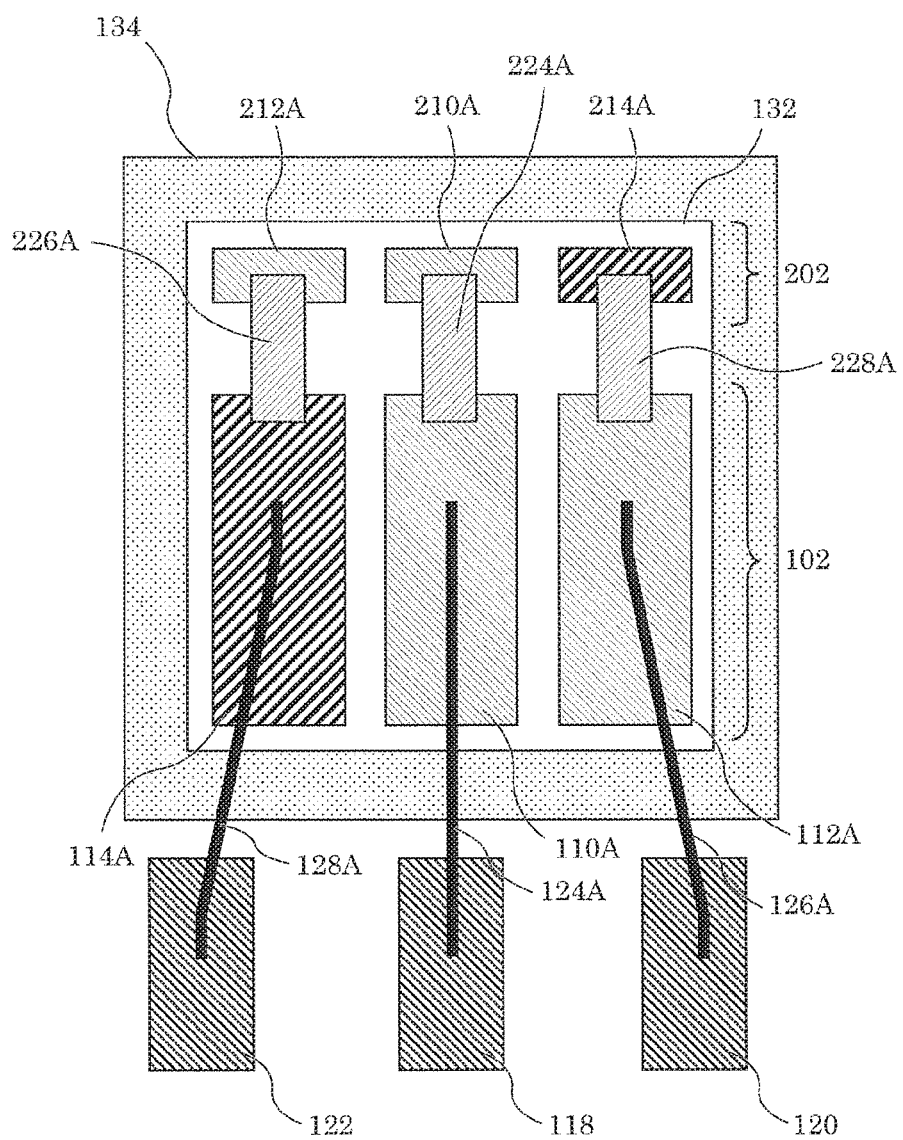
FIG. 4 is a plan view illustrating one example of an electrode arrangement of a semiconductor device according to Embodiment 1.

Next, an electrode arrangement of the semiconductor device according to the present embodiment is described with reference to FIG. 4. FIG. 4 is a plan view illustrating one example of the electrode arrangement of the semiconductor device according to the present embodiment. First chip 132 including first field-effect transistor element 102 and second field-effect transistor element 202 formed on the common substrate is fixed to pedestal 134.

First drain electrode pad 110A, first source electrode pad 112A, and first gate electrode pad 114A on first chip 132 are formed above first drain electrode 110, first source electrode 112, and first gate electrode 114 of first field-effect transistor element 102 via an insulating film. First drain electrode pad 110A, first source electrode pad 112A, and first gate electrode pad 114A are electrically connected to first drain electrode 110, first source electrode 112, and first gate electrode 114, respectively, via openings of the insulating film or the like. In other words, first field-effect transistor element 102 has a pad on element (POE) structure in which a pad electrode is formed above an element via an insulating film.

Likewise, second drain electrode pad 210A, second source electrode pad 212A, and second gate electrode pad 214A are a pad electrode electrically connected to second drain electrode 210, a pad electrode electrically connected to second source electrode 212, and a pad electrode electrically connected to second gate electrode 214, respectively.

The pad electrodes for first field-effect transistor element 102 and the pad electrodes for second field-effect transistor element 202 are arranged in such a way that the wiring connection illustrated in FIG. 1 can be easily installed. Specifically, first gate electrode pad 114A and second source electrode pad 212A are proximately located and electrically connected by line 226A. Likewise, first drain electrode pad 110A and second drain electrode pad 210A are proximately located and electrically connected by line 224A, and first source electrode pad 112A and second gate electrode pad 214A are proximately located and electrically connected by line 228A.

First gate electrode pad 114A is electrically connected to external gate terminal 122 by wire line 128A. Likewise, first drain electrode pad 110A is electrically connected to external drain terminal 118 by wire line 124A, and first source electrode pad 112A is electrically connected to external source terminal 120 by wire line 126A. Note that wire line 124A, wire line 126A, and wire line 128A are made from metal such as Al, Cu, and Au.

The pad electrodes for first field-effect transistor element 102 are arranged on the side on which external gate terminal 122, external drain terminal 118, and external source terminal 120 are arranged because areas for wire bonding can be easily secured in the pad electrodes for first field-effect transistor element 102 which are larger than the pad electrodes for second field-effect transistor element 202.

Figure 5:
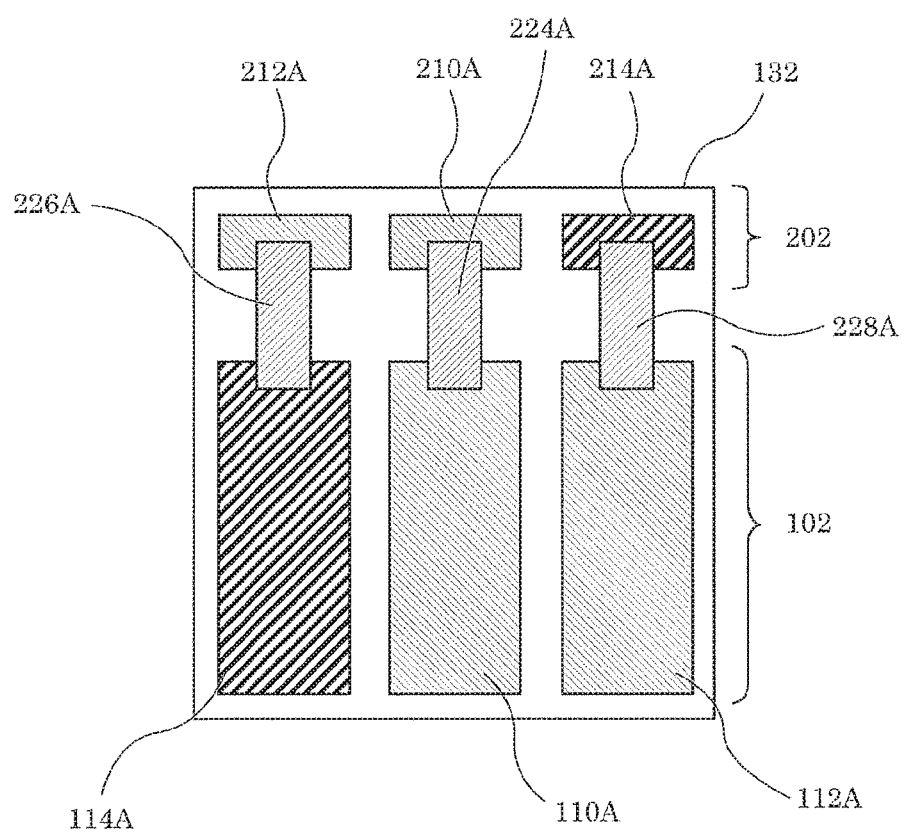
FIG. 5 is a plan view illustrating another example of an electrode arrangement of a semiconductor device according to Embodiment 1.

FIG. 5 is a plan view illustrating another example of the electrode arrangement of the semiconductor device according to the present embodiment. As with the configuration in FIG. 4, first chip 132 includes first field-effect transistor element 102 and second field-effect transistor element 202 formed on a common substrate. Note that in contrast to the configuration in FIG. 4, first chip 132 is not fixed to a pedestal.

First drain electrode pad 110A, first source electrode pad 112A, and first gate electrode pad 114A on first chip 132 are a pad electrode electrically connected to first drain electrode 110 of first field-effect transistor element 102, a pad electrode electrically connected to first source electrode 112 of first field-effect transistor element 102, and a pad electrode electrically connected to first gate electrode 114 of first field-effect transistor element 102, respectively.

Second drain electrode pad 210A, second source electrode pad 212A, and second gate electrode pad 214A are a pad electrode electrically connected to second drain electrode 210 of second field-effect transistor element 202, a pad electrode electrically connected to second source electrode 212 of second field-effect transistor element 202, and a pad electrode electrically connected to second gate electrode 214 of second field-effect transistor element 202, respectively.

As in the configuration in FIG. 4, first gate electrode pad 114A and second source electrode pad 212A are proximately located and electrically connected by line 226A. Likewise, first drain electrode pad 110A and second drain electrode pad 210A are proximately located and electrically connected by line 224A. And first source electrode pad 112A and second gate electrode pad 214A are proximately located and electrically connected by line 228A In the configuration in FIG. 5, in contrast to the configuration in FIG. 4, first drain electrode pad 110A, first source electrode pad 112A, and first gate electrode pad 114A play the role of external drain terminal 118, the role of external source terminal 120, and the role of external gate 122, respectively. This means that first chip 132 is designed to be able to be flip-chip mounted.

Figure 6:
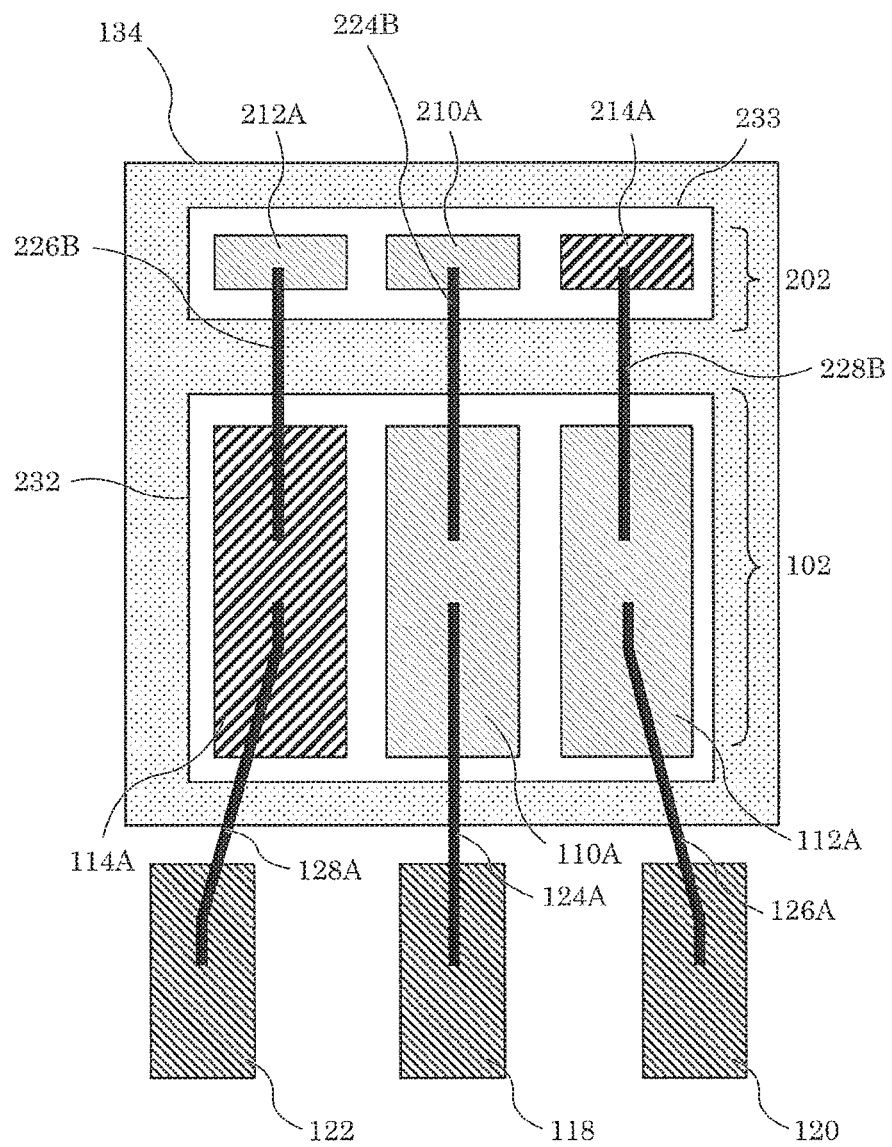
FIG. 6 is a plan view illustrating one example of a chip arrangement of a semiconductor device according to Embodiment 1.

FIG. 6 is a plan view illustrating one example of a chip arrangement of the semiconductor device according to the present embodiment. In contrast to the configurations in FIG. 4 and FIG. 5, first field-effect transistor element 102 and second field-effect transistor element 202 are formed on separate substrates. Specifically, second chip 232 including first field-effect transistor element 102 and third chip 233 including second field-effect transistor element 202 are fixed to pedestal 134.

First drain electrode pad 110A, first source electrode pad 112A, and first gate electrode pad 114A on second chip 232 are a pad electrode electrically connected to first drain electrode 110 of first field-effect transistor element 102, a pad electrode electrically connected to first source electrode 112 of first field-effect transistor element 102, and a pad electrode electrically connected to first gate electrode 114 of first field-effect transistor element 102, respectively.

Second drain electrode pad 210A, second source electrode pad 212A, and second gate electrode pad 214A on third chip 233 are a pad electrode electrically connected to second drain electrode 210 of second field-effect transistor element 202, a pad electrode electrically connected to second source electrode 212 of second field-effect transistor element 202, and a pad electrode electrically connected to second gate electrode 214 of second field-effect transistor element 202, respectively.

In the configuration in FIG. 6, in contrast to the configuration in FIG. 4, first gate electrode pad 114A and second source electrode pad 212A are electrically connected by wire line 226B, first drain electrode pad 110A and second drain electrode pad 210A are electrically connected by wire line 224B, and first source electrode pad 112A and second gate electrode pad 214A are electrically connected by wire line 228B.

As in the configuration in FIG. 4, first gate electrode pad 114A is electrically connected to external gate terminal 122 by wire line 128A. Likewise, first drain electrode pad 110A is electrically connected to external drain terminal 118 by wire line 124A. And first source electrode pad 112A is electrically connected to external source terminal 120 by wire line 126A Embodiment 2

Figure 7:
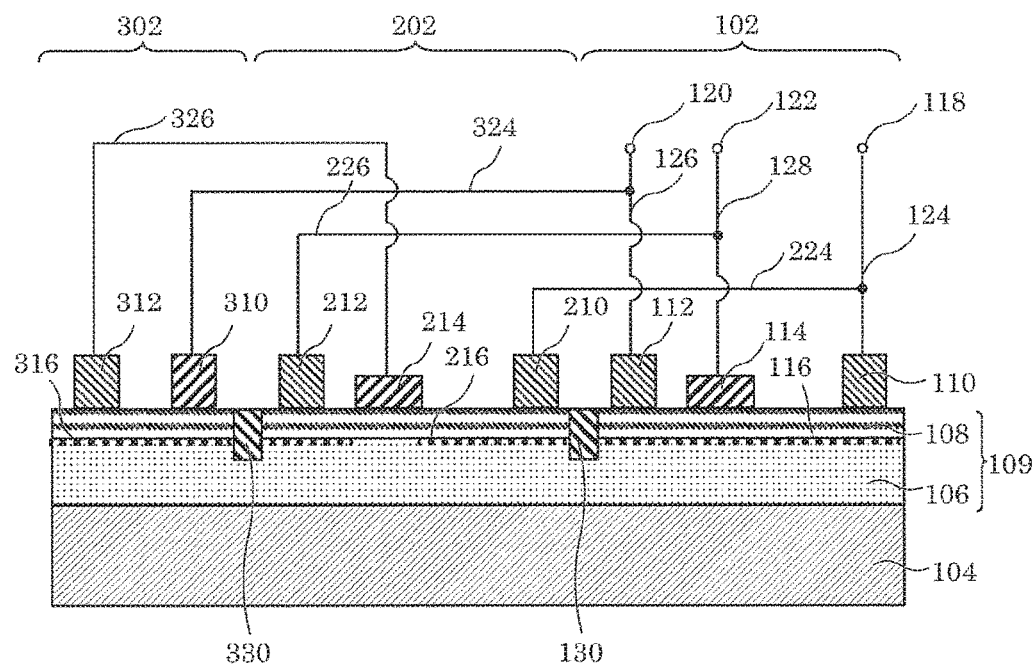
FIG. 7 is a schematic cross-sectional view illustrating a semiconductor device according to Embodiment 2.
Figure 8:
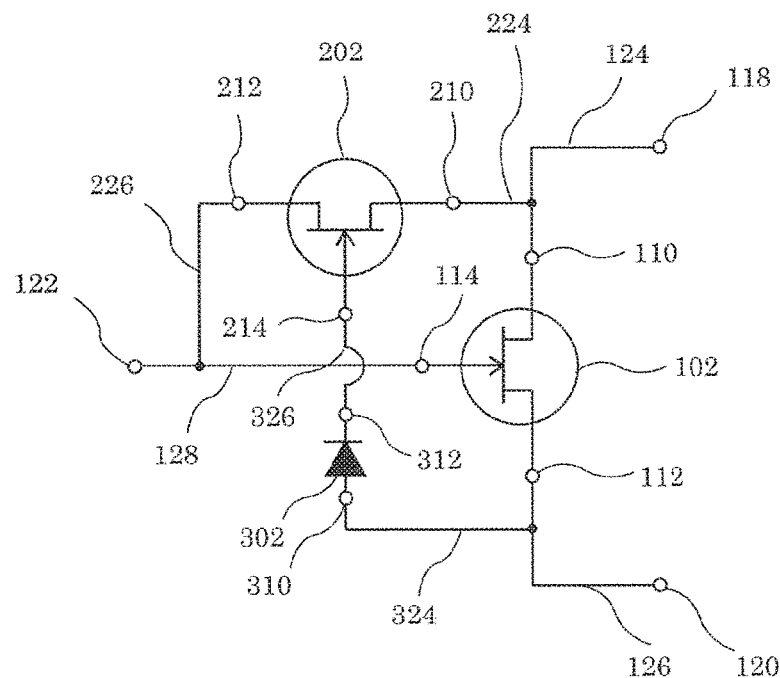
FIG. 8 is an equivalent circuit diagram illustrating a semiconductor device according to Embodiment 2.

A semiconductor device according to Embodiment 2 will be described below with reference to the drawings. FIG. 7 is a schematic cross-sectional view illustrating a semiconductor device according to Embodiment 2. FIG. 8 is an equivalent circuit diagram illustrating the semiconductor device according to Embodiment 2. In FIG. 7 and FIG. 8, elements that are the same as those in FIG. 1 and FIG. 2 are assigned the same reference signs, and description thereof will be omitted.

In the present embodiment, as illustrated in FIG. 8, first voltage drop element 302 is provided in an electric current path from first source electrode 112 to second gate electrode 214, in addition to the configuration in Embodiment 1. A diode that allows an electric current to flow in the forward direction from first source electrode 112 to second gate electrode 214 is used as first voltage drop element 302. The other elements are the same as or similar to those in Embodiment 1.

As illustrated in FIG. 7, first voltage drop element 302 is configured by forming first anode electrode 310 and first cathode electrode 312 above channel layer 106 via barrier layer 108. As with first channel region 116 and second channel region 216, highly concentrated two-dimensional electron gas is generated at the junction interface between channel layer 106 and barrier layer 108 below first anode electrode 310 and first cathode electrode 312, and this highly concentrated two-dimensional electron gas forms third channel region 316. An electric current at first voltage drop element 302 flows from first anode electrode 310 to first cathode electrode 312 via third channel region 316. A trench may be formed in barrier layer 108, and first anode electrode 310 and first cathode electrode 312 may be formed on the trench. Note that first cathode electrode 312 is in ohmic contact with third channel region 316.

Furthermore, third channel region 316 is separated from first channel region 116 and second channel region 216 by second element isolation region 330. As with first element isolation region 130, second element isolation region 330, which is made from a material that can prevent the transfer of carriers such as electrons, can be formed by implanting boron ions, iron ions, or other ions in channel layer 106 and barrier layer 108.

First anode electrode 310 uses a material that forms a depletion layer extending from first anode electrode 310 toward substrate 104 in barrier layer 108 and channel layer 106. This means that first anode electrode 310 allows an electric current to flow to third channel region 316 by forming a Schottky junction or a p-n junction with barrier layer 108 or channel layer 106.

For example, a layer made of metal such as Ti, Al, Mo, or Hf can be used as first cathode electrode 312. Two or more layers made of these kinds of metal may be combined to form a stacked body.

A layer made of metal such as Ti, Al, Ni, Pt, Pd, Au, Mo, or Hf may be used as first anode electrode 310. Two or more layers made of these kinds of metal may be combined to form a stacked body. A stacked body composed of a metal layer and a p-type semiconductor may alternatively be used as first anode electrode 310. In this case, the p-type semiconductor is inserted between the metal layer and channel layer 106. In the case of combining the metal layer and the p-type semiconductor into a stacked body as first anode electrode 310, it is possible to use, for example, magnesium (Mg)-doped p-type $In_cAl_dGa_{1-(c+d)}N$ (where $0 \leq c \leq 1$ and $0 \leq d \leq 1$), and may also be possible to use p-type GaN (i.e., $c=d=0$), as the p-type semiconductor.

First anode electrode 310 and first source electrode 112 are electrically connected to each other by line 324, and first cathode electrode 312 and second gate electrode 214 are electrically connected to each other by line 326.

As described in Embodiment 1, with the use of second field-effect transistor element 202, when a surge voltage that is negative with respect to first source electrode 112 (external source terminal 120) is applied to first gate electrode 114 (external gate terminal 122), a surge current can flow from external source terminal 120 connected to first source electrode 112 to external gate terminal 122 connected to first gate electrode 114, through second gate electrode 214 and second source electrode 212.

However, when a voltage that is negative with respect to first source electrode 112 is applied to first gate electrode 114 to quickly turn OFF first field-effect transistor element 102, second gate electrode 214 has a positive potential with respect to second source electrode 212. Thus, a leakage current will flow to an electric current path extending from first source electrode 112 toward first gate electrode 114 via second gate electrode 214 and second source electrode 212. As a result, the value of a negative voltage that can be applied between first gate electrode 114 and first source electrode 112 is limited to no more than a drop voltage in the electric current path extending from first source electrode 112 toward first gate electrode 114 via second gate electrode 214 and second source electrode 212. In other words, a negative voltage that is greater than or equal to a forward voltage applied between second gate electrode 214 and second source electrode 212 of second field-effect transistor element 202 cannot be applied between first gate electrode 114 and first source electrode 112.

For this reason, there is the possibility that first field-effect transistor element 102 fails to be quickly turned OFF due to a failure to apply a sufficient negative voltage to first gate electrode 114.

Thus, in the present embodiment, first voltage drop element 302 is provided in the electric current path from first source electrode 112 to second gate electrode 214. This makes it possible to apply, between first gate electrode 114 and first source electrode 112, a negative voltage whose value is up to a value obtained by adding the value of a drop voltage at first voltage drop element 302 to the value of a forward voltage applied between second gate electrode 214 and second source electrode 212 of second field-effect transistor element 202. Consequently, a negative voltage that allows first field-effect transistor element 102 to be quickly turned OFF can be applied to first gate electrode 114.

The ability to pass a surge current is hardly affected because a diode that allows an electric current to flow in the forward direction from first source electrode 112 to second gate electrode 214 is used as first voltage drop element 302.

As described above, in the present embodiment, the occurrence of a leakage current flowing from first source electrode 112 toward first gate electrode 114 is reduced while maintaining the tolerance for a surge voltage that is applied to first gate electrode 114 and is negative with respect to first source electrode 112. With this, it is possible to normally perform the driving operation to apply a negative voltage to first gate electrode 114 of first field-effect transistor element 102.

Furthermore, in Embodiment 1, when a surge voltage that is negative with respect to first drain electrode 110 of first field-effect transistor element 102 is applied to first gate electrode 114 of first field-effect transistor element 102, the voltage of second gate electrode 214 increases due to capacitive coupling between second gate electrode 214 and second drain electrode 210. Thus, second field-effect transistor element 202 is turned ON, allowing a surge current to flow from external drain terminal 118 connected to first drain electrode 110 to external gate terminal 122 connected to first gate electrode 114.

There is, however, the possibility that when charges (holes) of second gate electrode 214 induced by capacitive coupling escape toward first source electrode 112, the voltage of second gate electrode 214 does not increase enough, reducing the amount of a surge current that flows from first drain electrode 110 to first gate electrode 114 through second drain electrode 210 and second source electrode 212.

In the present embodiment, first voltage drop element 302 which includes a diode that allows an electric current to flow in the forward direction from first source electrode 112 to second gate electrode 214 is provided in the electric current path from second gate electrode 214 to first source electrode 112. With this, it is possible to inhibit charges (holes) of second gate electrode 214 induced by capacitive coupling to flow toward first source electrode 112. Thus, it is possible to increase the voltage of second gate electrode 214 enough to securely maintain second field-effect transistor element 202 in the ON state. This allows an increase in the amount of a surge current that flows from second drain electrode 210 to second source electrode 212 of second field-effect transistor element 202.

As described above, it is possible to improve the tolerance for a surge voltage that is applied to first gate electrode 114 and is negative with respect to first drain electrode 110.

In the present embodiment, the number of first voltage drop elements 302 does not need to be one; a plurality of first voltage drop elements 302 may be connected in series. This increases the effect of inhibiting the leakage current that flows from first source electrode 112 toward first gate electrode 114, making it possible to perform the driving operation to apply a higher negative voltage to first gate electrode 114 of first field-effect transistor element 102.

In the present embodiment, first voltage drop element 302 may have a transistor structure. For example, it is possible to form first voltage drop element 302 with a transistor structure by using, as first anode electrode 310, an electrode formed by creating a short circuit between the gate electrode and the source electrode of the transistor structure, and using the drain electrode of the transistor structure as first cathode electrode 312.

In the present embodiment, first voltage drop element 302 may be a bi-directional diode. Even though an electric current flows bidirectionally, it is possible to use a bi-directional diode as long as a negative voltage that quickly turns OFF first field-effect transistor element 102 can be added to first gate electrode 114 due to a voltage drop by first voltage drop element 302.

In the present embodiment, an electrode of first voltage drop element 302 may be formed in the same electrode manufacturing process as an electrode of first field-effect transistor element 102 and an electrode of second field-effect transistor element 202. This allows the process of manufacturing the semiconductor device according to the present embodiment to be significantly simplified compared with the case in which these electrodes are formed in separate electrode manufacturing processes.

In the present embodiment, first voltage drop element 302 may be smaller in element size than first field-effect transistor element 102. In this case, it is possible to reduce the increase in parasitic capacitance of first field-effect transistor element 102 that is due to first voltage drop element 302. Specifically, the element size of first voltage drop element 302 is preferably one tenth to one thousandth, more preferably about one hundredth, of that of first field-effect transistor element 102.

In the present embodiment, the materials of channel layer 106 and barrier layer 108 in first voltage drop element 302 and the materials of channel layer 106 and barrier layer 108 in first field-effect transistor element 102 and second field-effect transistor element 202 may be different from each other. In such a case, channel layer 106 and barrier layer 108 for first voltage drop element 302 and channel layer 106 and barrier layer 108 for first field-effect transistor element 102 and second field-effect transistor element 202 may be formed in different manufacturing processes using substrate 104 as a common substrate. Alternatively, first voltage drop element 302 and first and second field-effect transistor elements 102 and 202 may be formed using separate substrates 104.

Variation of Embodiment 2

Figure 9:
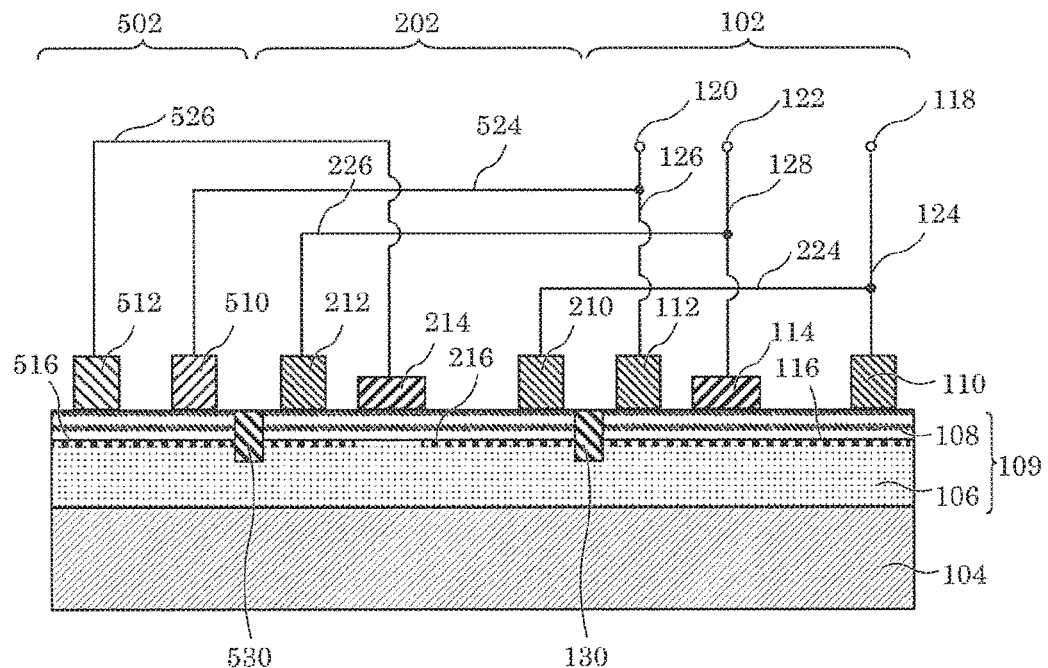
FIG. 9 is a schematic cross-sectional view illustrating a semiconductor device according to a variation of Embodiment 2.
Figure 10:
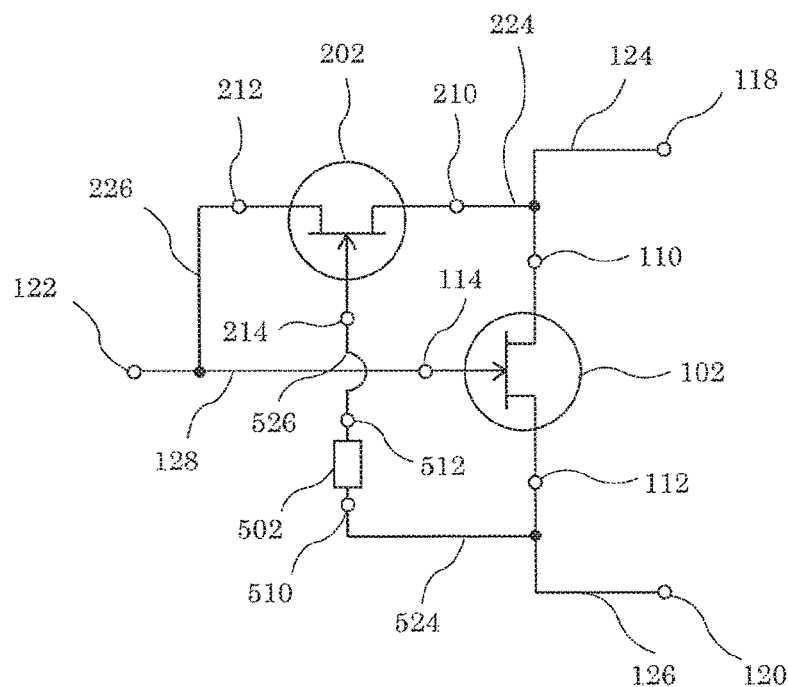
FIG. 10 is an equivalent circuit diagram illustrating a semiconductor device according to a variation of Embodiment 2.

A semiconductor device according to a variation of Embodiment 2 will be described below with reference to the drawings. FIG. 9 is a schematic cross-sectional view illustrating a semiconductor device according to a variation of Embodiment 2. FIG. 10 is an equivalent circuit diagram illustrating the semiconductor device according to the variation of Embodiment 2. In FIG. 9 and FIG. 10, elements that are the same as those in FIG. 1 and FIG. 2 are assigned the same reference signs, and description thereof will be omitted.

A diode is used as first voltage drop element 302 in Embodiment 2, but in the present embodiment, impedance element 502 which includes a high resistance element is used as first voltage drop element 302, as illustrated in FIG. 10. In other words, impedance element 502 is provided in the electric current path from second gate electrode 214 to first source electrode 112. Impedance element 502 inhibits an electric current flowing from second gate electrode 214 to first source electrode 112. The other elements are the same as or similar to those in Embodiment 2.

As illustrated in FIG. 9, impedance element 502 includes electrode 510 and electrode 512 formed above channel layer 106 via barrier layer 108. As with third channel region 316, highly concentrated two-dimensional electron gas is generated at the junction interface between channel layer 106 and barrier layer 108 below electrode 510 and electrode 512, and this highly concentrated two-dimensional electron gas forms fifth channel region 516. An electric current at impedance element 502 flows from electrode 510 to electrode 512 via fifth channel region 516.

Furthermore, fifth channel region 516 is separated from first channel region 116 and second channel region 216 by fourth element isolation region 530. Fourth element isolation region 530 can be formed in the same or similar manner as second element isolation region 330.

Note that at least one of electrode 510 and electrode 512 is connected to fifth channel region 516 in a high resistance state. For example, one of electrode 510 and electrode 512 is formed above channel layer 106 via an insulator such as silicon nitride or silicon oxide. A layer made of metal such as Ti, Al, Mo, or Hf or a stacked body formed by combining these kinds of metal can be used as electrode 510 and electrode 512.

Electrode 510 and first source electrode 112 are electrically connected to each other by line 524, and electrode 512 and second gate electrode 214 are electrically connected to each other by line 526.

Impedance element 502 in the present variation plays the role as a voltage drop element in the electric current path from first source electrode 112 to second gate electrode 214 and is also capable of inhibiting charges at second gate electrode 214 from flowing toward first source electrode 112. Therefore, impedance element 502 produces the same or similar advantageous effects as first voltage drop element 302 included in the configuration according to Embodiment 2.

The use of impedance element 502 as first voltage drop element 302 can increase the degree of configuration flexibility about a drop voltage value by setting the resistance value of impedance element 502 to an arbitrary value, compared with the case where a diode is used as first voltage drop element 302.

On the other hand, impedance element 502 serves as resistance against the surge current that flows from first source electrode 112 to second gate electrode 214; therefore, focusing on the ability to pass a surge current, the use of a diode as first voltage drop element 302 allows a larger amount of the surge current to flow.

Impedance element 502 is not limited to the high resistance element and may be any element that can prevent an electric current from flowing from second gate electrode 214 toward first source electrode 112; for example, an inductor element can be used as impedance element 502.

Impedance element 502 in the present variation can be implemented in the same or similar manner as first voltage drop element 302 in Embodiment 2 described above.

Note that impedance element 502 in the present variation and first voltage drop element 302 in Embodiment 2 may be used together.

Embodiment 3

Figure 11:
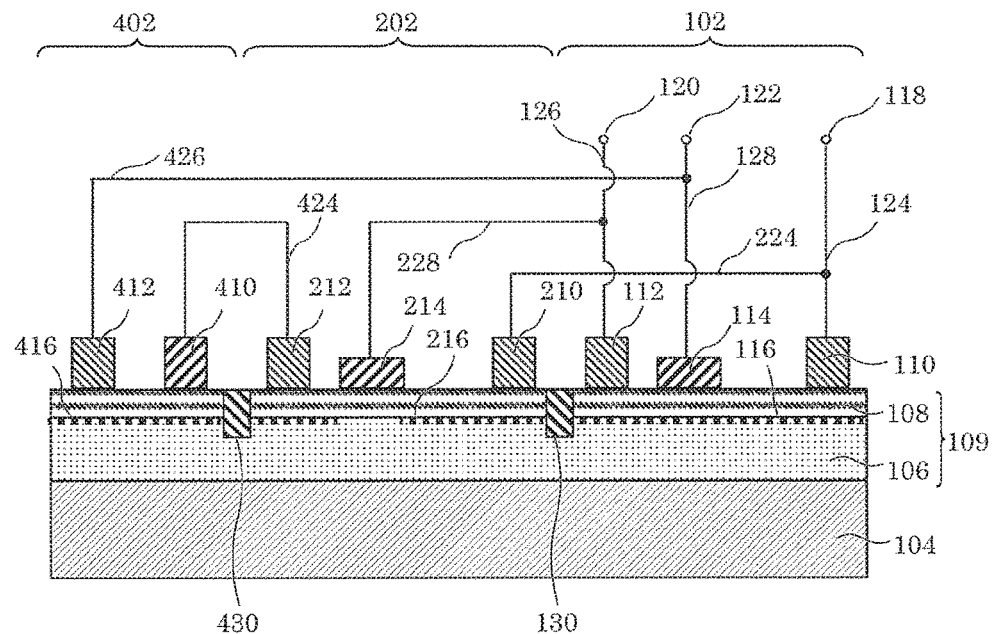
FIG. 11 is a schematic cross-sectional view illustrating a semiconductor device according to Embodiment 3.
Figure 12:
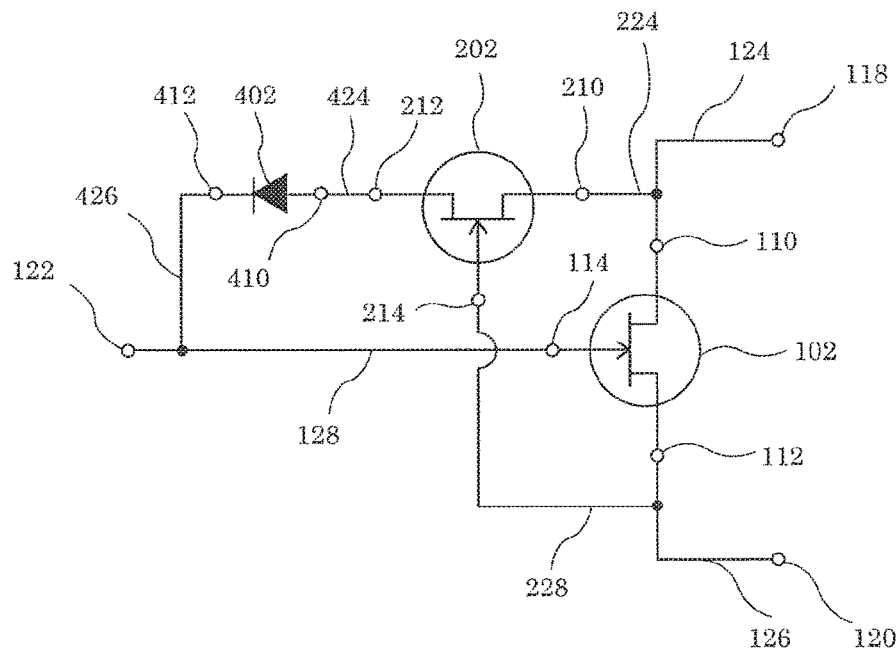
FIG. 12 is an equivalent circuit diagram illustrating a semiconductor device according to Embodiment 3.

A semiconductor device according to Embodiment 3 will be described below with reference to the drawings. FIG. 11 is a schematic cross-sectional view illustrating the semiconductor device according to Embodiment 3. FIG. 12 is an equivalent circuit diagram illustrating the semiconductor device according to Embodiment 3. In FIG. 11 and FIG. 12, elements that are the same as those in FIG. 1 and FIG. 2 are assigned the same reference signs, and description thereof will be omitted.

In the present embodiment, as illustrated in FIG. 12, a second voltage drop element 402 is provided in an electric current path from second source electrode 212 to first gate electrode 114, in addition to the configuration in Embodiment 1. A diode that allows an electric current to flow in the forward direction from second source electrode 212 to first gate electrode 114 is used as second voltage drop element 402. The other elements are the same as or similar to those in Embodiment 1.

As illustrated in FIG. 11, second voltage drop element 402 is configured by forming second anode electrode 410 and second cathode electrode 412 above channel layer 106 via barrier layer 108. As with third channel region 316, highly concentrated two-dimensional electron gas is generated at the junction interface between channel layer 106 and barrier layer 108 below second anode electrode 410 and second cathode electrode 412, and this highly concentrated two-dimensional electron gas forms fourth channel region 416. An electric current at second voltage drop element 402 flows from second anode electrode 410 to second cathode electrode 412 via fourth channel region 416. Note that second cathode electrode 412 is in ohmic contact with fourth channel region 416. Furthermore, second anode electrode 410 forms a Schottky junction or a p-n junction with barrier layer 108 or channel layer 106. A trench may be formed in barrier layer 108, and second anode electrode 410 and second cathode electrode 412 may be formed on the trench.

Furthermore, fourth channel region 416 is separated from first channel region 116 and second channel region 216 by third element isolation region 430. Third element isolation region 430 can be formed in the same or similar manner as second element isolation region 330.

Furthermore, second anode electrode 410 and second cathode electrode 412 can be formed using the same or similar materials and configurations as first anode electrode 310 and first cathode electrode 312.

Second anode electrode 410 and second source electrode 212 are electrically connected to each other by line 424, and second cathode electrode 412 and first gate electrode 114 are electrically connected to each other by line 426.

In the present embodiment, introducing second voltage drop element 402 in the electric current path from second source electrode 212 to first gate electrode 114 makes it possible to apply, between first gate electrode 114 and first source electrode 112, a negative voltage whose value is up to a value obtained by adding the value of a drop voltage at second voltage drop element 402 to the value of a forward voltage applied between second gate electrode 214 and second source electrode 212, as in Embodiment 2. Accordingly, it is possible to apply, to first gate electrode 114, a negative voltage that allows first field-effect transistor element 102 to be quickly turned OFF without the occurrence of a leakage current.

Furthermore, since second voltage drop element 402 is introduced in the electric current path from second source electrode 212 to first gate electrode 114, it is possible to also prevent the occurrence of operation failures caused by a leakage current that flows from first drain electrode 110 toward first gate electrode 114 via second drain electrode 210 and second source electrode 212.

In Embodiment, when a voltage that is negative with respect to first source electrode 112 is applied to first gate electrode 114 in order to quickly turn OFF first field-effect transistor element 102, second field-effect transistor element 202 is turned ON. Thus, a leakage current flows in the electric current path extending from first drain electrode 110 toward first gate electrode 114 via second drain electrode 210 and second source electrode 212. With this, there is the possibility that a sufficient negative voltage cannot be applied to first gate electrode 114, failing to cause first field-effect transistor element 102 to be quickly turned OFF.

In light of this, second voltage drop element 402 is provided in the electric current path from second source electrode 212 to first gate electrode 114 in the present embodiment. With this, the negative voltage that can be applied between first gate electrode 114 and first source electrode 112 can be increased by the value of a drop voltage at second voltage drop element 402. Thus, it is possible to apply, to first gate electrode 114, a negative voltage that allows first field-effect transistor element 102 to be quickly turned OFF.

Note that since a diode that allows an electric current to flow in the forward direction from second source electrode 212 to first gate electrode 114 is used as second voltage drop element 402, the ability to pass a surge current is hardly affected.

Thus, in the present embodiment, the occurrence of a leakage current flowing from first source electrode 112 toward first gate electrode 114 and the occurrence of a leakage current flowing from first drain electrode 110 toward first gate electrode 114 can be reduced while maintaining the tolerance for surge voltages that are applied between first gate electrode 114 and first source electrode 112 and between first gate electrode 114 and first drain electrode 110. With this, it is possible to normally perform the driving operation to apply a negative voltage to first gate electrode 114 of first field-effect transistor element 102.

Second voltage drop element 402 in the present embodiment can also be implemented in the same or similar manner as first voltage drop element 302 in Embodiment 2 described above. Second voltage drop element 402 in the present embodiment and first voltage drop element 302 in Embodiment 2 or impedance element 502 in the variation of Embodiment 2 may be used together.

Furthermore, second voltage drop element 402 in the present embodiment may be replaced by impedance element 502 described in the variation of Embodiment 2.

Embodiment 4

Figure 13:
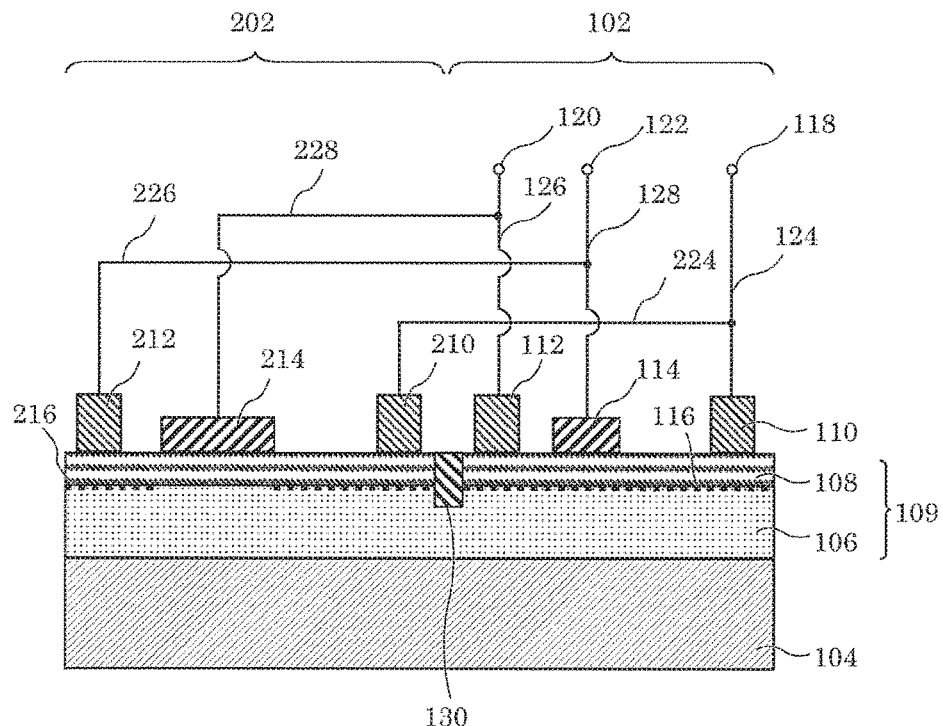
FIG. 13 is a schematic cross-sectional view illustrating a semiconductor device according to Embodiment 4.

A semiconductor device according to Embodiment 4 will be described below with reference to the drawings. FIG. 13 is a schematic cross-sectional view illustrating the semiconductor device according to Embodiment 4. In FIG. 13, elements that are the same as those in FIG. 1 are assigned the same reference signs, and description thereof will be omitted.

As illustrated in FIG. 13, in the present embodiment, the gate length of second gate electrode 214 is greater than the gate length of first gate electrode 114 in contrast to Embodiment 1. The other elements are the same as or similar to those in Embodiment 1.

This makes it possible to increase the area of second gate electrode 214 and thus increase the amount of an electric current that can flow from second gate electrode 214 to second channel region 216. This means that it is possible to increase the amount of an electric current that can flow from second gate electrode 214 to second source electrode 212. Therefore, it is possible to increase the amount of a surge current that can flow from second gate electrode 214 via second source electrode 212 when a surge voltage that is negative with respect to first source electrode 112 is applied to first gate electrode 114.

Thus, it is possible to further improve the tolerance of first field-effect transistor element 102 for a surge voltage that is applied to first gate electrode 114 and is negative with respect to first source electrode 112.

Note that although the semiconductor device in Embodiment 1 is used in the description of the present embodiment, the semiconductor devices in other embodiments can also be used in the present embodiment.

Embodiment 5

Figure 14:
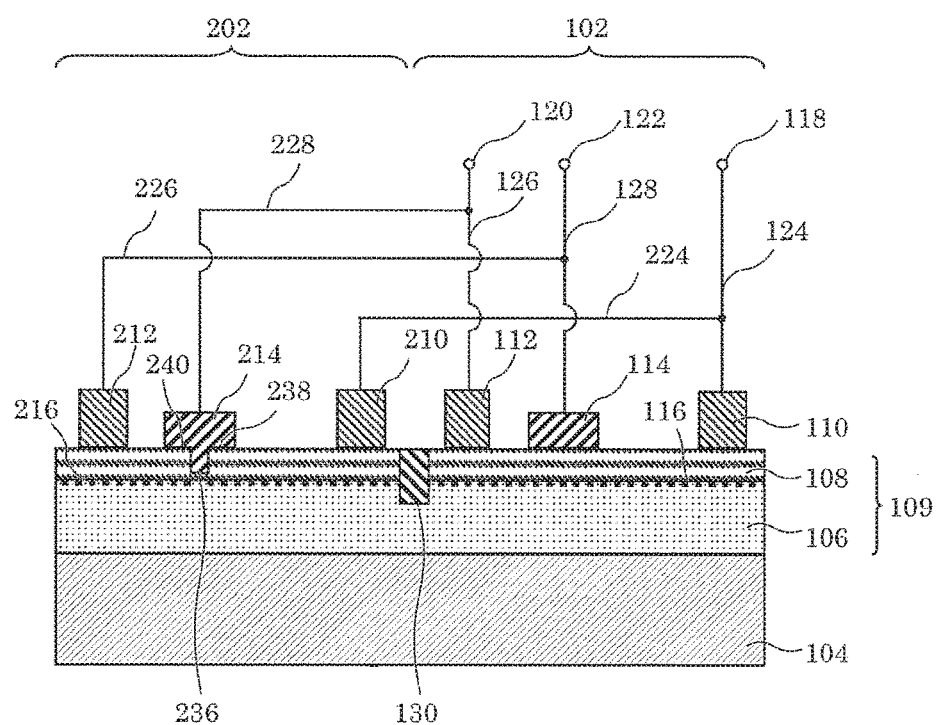
FIG. 14 is a schematic cross-sectional view illustrating a semiconductor device according to Embodiment 5.

A semiconductor device according to Embodiment 5 will be described below with reference to the drawings. FIG. 14 is a schematic cross-sectional view illustrating the semiconductor device according to Embodiment 5. In FIG. 14, elements that are the same as those in FIG. 1 are assigned the same reference signs, and description thereof will be omitted.

As illustrated in FIG. 14, in the present embodiment, second gate electrode 214 is provided on second gate recess 236 of barrier layer 108 in contrast to Embodiment 1. Note that the gate recess is a depression which is formed in the shape of a trench or the like in barrier layer 108 and on which the gate electrode is formed. Second gate electrode 214 herein is formed on second gate recess 236 and surrounding barrier layer 108. Specifically, second gate electrode 214 includes, in addition to a portion formed inside second gate recess 236, a portion formed on second non-gate recess 238 which is adjacent to second gate recess 236 and located on the second drain electrode 210 side, and a portion formed on second non-gate recess 240 which is adjacent to second gate recess 236 and located on the second source electrode 212 side. The other elements are the same as or similar to those in Embodiment 1.

In this case, second gate electrode 214 inside second gate recess 236 is closer to second channel region 216, allowing for an increase in the dissipation amount of the two-dimensional electron gas in second channel region 216 immediately below second gate recess 236. The leakage current that flows between second drain electrode 210 and second source electrode 212 of second field-effect transistor element 202 can therefore be reduced. Thus, it is possible to reduce the leakage current that occurs due to introduction of second field-effect transistor element 202 and flows from first drain electrode 110 to first gate electrode 114 of first field-effect transistor element 102.

Furthermore, the introduction of second gate recess 236 allows second field-effect transistor element 202 to be normally OFF, and thus, a design that prevents two-dimensional electron gas in second channel region 216 immediately below second non-gate recess 238 and second non-gate recess 240 from dissipating is possible.

Note that although the semiconductor device in Embodiment 1 is used in the description of the present embodiment, the semiconductor devices in other embodiments can also be used in the present embodiment.

Embodiment 6

Figure 15:
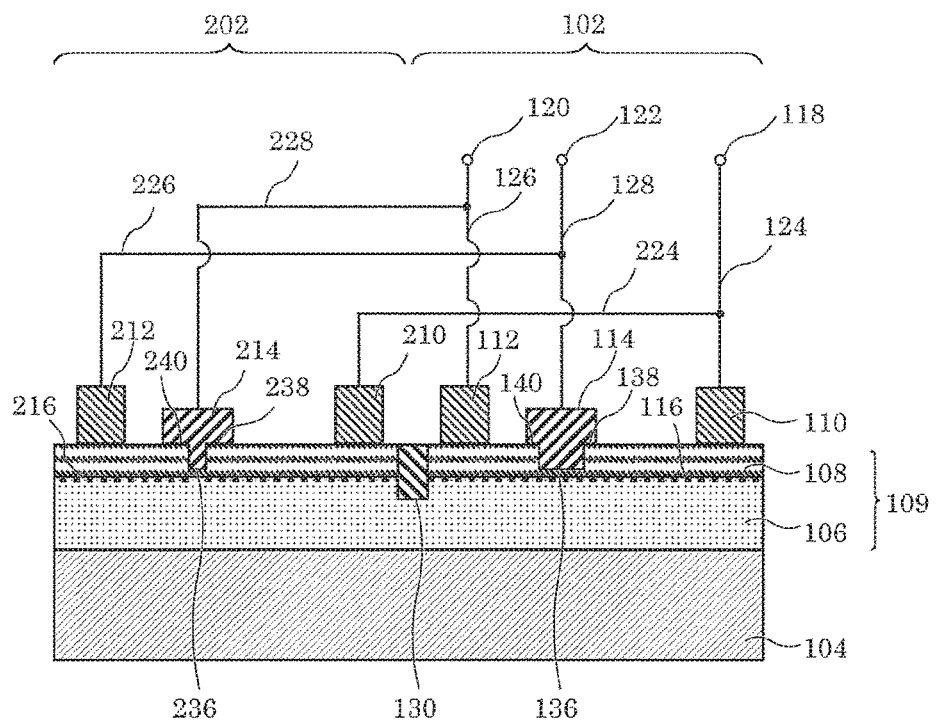
FIG. 15 is a schematic cross-sectional view illustrating a semiconductor device according to Embodiment 6.

A semiconductor device according to Embodiment 6 will be described below with reference to the drawings. FIG. 15 is a schematic cross-sectional view illustrating the semiconductor device according to Embodiment 6. In FIG. 15, elements that are the same as those in FIG. 1 are assigned the same reference signs, and description thereof will be omitted.

As illustrated in FIG. 15, in the present embodiment, first gate electrode 114 is provided on first gate recess 136, and second gate electrode 214 is provided on second gate recess 236 of barrier layer 108, in contrast to Embodiment 1. The gate-lengthwise width of second gate recess 236 is less than the gate-lengthwise width of first gate recess 136. Gate-lengthwise as used herein means a direction from the source electrode toward the drain electrode.

First gate electrode 114 is formed on first gate recess 136 and surrounding barrier layer 108. Specifically, first gate electrode 114 includes, in addition to a portion formed on first gate recess 136, a portion formed on first non-gate recess 138 which is adjacent to first gate recess 136 and located on the first drain electrode 110 side, and a portion formed on first non-gate recess 140 which is adjacent to first gate recess 136 and located on the first source electrode 112 side. Likewise, second gate electrode 214 is formed on second gate recess 236 and surrounding barrier layer 108. Specifically, second gate electrode 214 includes, in addition to a portion formed on second gate recess 236, a portion formed on second non-gate recess 238 located on the second drain electrode 210 side, and a portion formed on second non-gate recess 240 located on the second source electrode 212 side. The other elements are the same as or similar to those in Embodiment 1.

In the present embodiment, with the configuration described above, the effective gate length of second field-effect transistor element 202 is small, and thus it is possible to enhance the maximum value of a drain current. Therefore, it is possible to increase the amount of a surge current that can flow from second drain electrode 210 via second source electrode 212 when a surge voltage that is negative with respect to first drain electrode 110 is applied to first gate electrode 114.

With this, it is possible to further improve the tolerance of first field-effect transistor element 102 for a surge voltage that is applied to first gate electrode 114 and is negative with respect to first drain electrode 110.

Furthermore, first field-effect transistor element 102 can be configured as a normally-off field-effect transistor element by introducing first gate recess 136. Therefore, when this semiconductor device is used as a power switching element, an accident such as an electrical short circuit can be prevented even if a failure occurs in a gate drive circuit, and thus the security of the device can be ensured.

Note that although the semiconductor device in Embodiment 1 is used in the description of the present embodiment, the semiconductor devices in other embodiments can also be used in the present embodiment.

Embodiment 7

Figure 16:
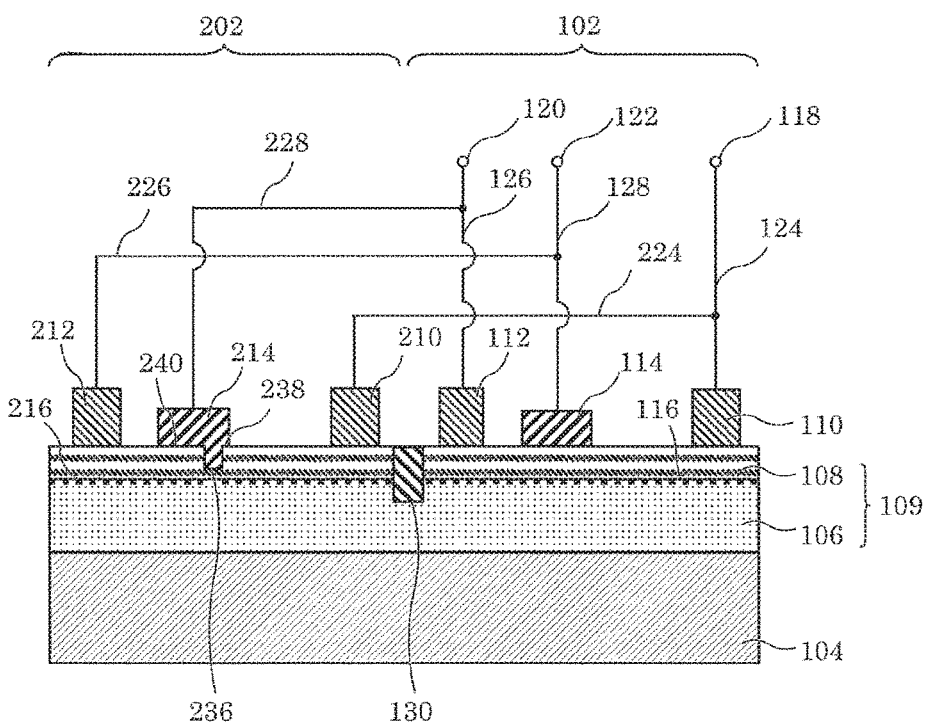
FIG. 16 is a schematic cross-sectional view illustrating a semiconductor device according to Embodiment 7.
Figure 17:
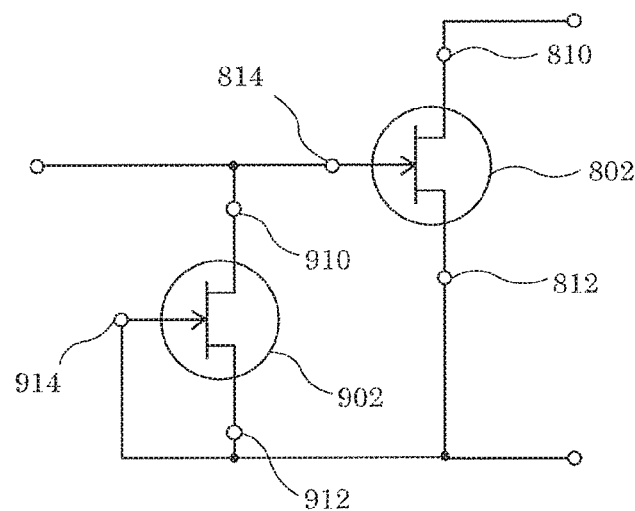
FIG. 17 is an equivalent circuit diagram illustrating a semiconductor device according to the related art.

A semiconductor device according to Embodiment 7 will be described below with reference to the drawings. FIG. 16 is a schematic cross-sectional view illustrating the semiconductor device according to Embodiment 7. In FIG. 16, elements that are the same as those in FIG. 1 are assigned the same reference signs, and description thereof will be omitted.

As illustrated in FIG. 16, in the present embodiment, second gate electrode 214 is provided on second gate recess 236, and the center of second gate recess 236 is located closer to second drain electrode 210 than the center of second gate electrode 214 is, in contrast to Embodiment 1. Second gate electrode 214 herein is formed on second gate recess 236 and surrounding barrier layer 108. Specifically, second gate electrode 214 includes, in addition to a portion formed on second gate recess 236, a portion formed on second non-gate recess 238 located on the second drain electrode 210 side, and a portion formed on second non-gate recess 240 located on the second source electrode 212 side. Thus, the gate-lengthwise width of second non-gate recess 240 is greater than the gate-lengthwise width of second non-gate recess 238. The other elements are the same as or similar to those in Embodiment 1.

In the present embodiment, the introduction of second gate recess 236 allows second field-effect transistor element 202 to be normally OFF, and thus, a design that prevents two-dimensional electron gas in second channel region 216 immediately below second non-gate recess 238 and second non-gate recess 240 from dissipating is possible.

Furthermore, since the gate-lengthwise width of second non-gate recess 240 is greater than the gate-lengthwise width of second non-gate recess 238, it is possible to increase the amount of an electric current that flows from second drain electrode 214 toward second source electrode 212 via second non-gate recess 240 and second channel region 216 located immediately below second non-gate recess 240. This means that it is possible to increase the amount of an electric current that can flow from second gate electrode 214 toward second source electrode 212 while maintaining the normally-off characteristics of second field-effect transistor element 202.

Thus, it is possible to increase the amount of a surge current that can flow from second gate electrode 214 via second source electrode 212, while inhibiting the occurrence of a leakage current, when a surge voltage that is negative with respect to first source electrode 112 is applied to first gate electrode 114.

In this way, it is possible to further improve the tolerance of first field-effect transistor element 102 for a surge voltage that is applied to first gate electrode 114 and is negative with respect to first source electrode 112.

Note that although the semiconductor device in Embodiment 1 is used in the description of the present embodiment, the semiconductor devices in other embodiments can also be used in the present embodiment.

Although substrate 104 made of silicon is used in the above embodiments, substrate 104 is not limited to this substrate; for example, a sapphire substrate, a SiC substrate, a GaN substrate, or the like may be used as substrate 104.

Furthermore, although a nitride semiconductor is used as the semiconductor layer stacked body in the above embodiments, other compound semiconductors including GaAs, GaP, InP, CdTe, ZnSe, and SiC, for example, may be used as the semiconductor layer stacked body.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device according to the present disclosure is useful as a power transistor that is used in an inverter, a power supply circuit, or the like.

What is claimed is:
1. A semiconductor device, comprising:
a first semiconductor layer stacked body including a compound semiconductor;
a first field-effect transistor element including a first drain electrode, a first source electrode, and a first gate electrode that are provided on the first semiconductor layer stacked body;
a second semiconductor layer stacked body including a compound semiconductor; and
a second field-effect transistor element including a second drain electrode, a second source electrode, and a second gate electrode that are provided on the second semiconductor layer stacked body, the second field-effect transistor element serving as a protection element for the first field-effect transistor element, wherein the first field-effect transistor element includes a first channel layer and a first barrier layer provided on the first channel layer, the second field-effect transistor element includes a second channel layer and a second barrier layer provided on the second channel layer, the second gate electrode forms either one of a Schottky junction and a p-n junction with the second semiconductor layer stacked body, the second drain electrode is electrically connected to the first drain electrode, the second source electrode is electrically connected to the first gate electrode, and the second gate electrode is electrically connected to the first source electrode.

2. The semiconductor device according to claim 1, further comprising
a first voltage drop element provided in an electric current path from the first source electrode to the second gate electrode.

3. The semiconductor device according to claim 1, further comprising
a second voltage drop element provided in an electric current path from the second source electrode to the first gate electrode.

4. The semiconductor device according to claim 2, wherein the first voltage drop element is a diode.

5. The semiconductor device according to claim 3, wherein the second voltage drop element is a diode.

6. The semiconductor device according to claim 1, wherein the second gate electrode has a gate length greater than a gate length of the first gate electrode.

7. The semiconductor device according to claim 1, wherein the second gate electrode is provided on a second gate recess that is a depression formed in the second barrier layer.

8. The semiconductor device according to claim 7, wherein the first gate electrode is provided on a first gate recess that is a depression formed in the first barrier layer, and the second gate recess has a gate-lengthwise width less than a gate-lengthwise width of the first gate recess.

9. The semiconductor device according to claim 7, wherein a center of the second gate recess is located closer to the second drain electrode than a center of the second gate electrode is as viewed gate-lengthwise.

* * * * *